United States Patent
Zhong et al.

(10) Patent No.: US 9,460,525 B2
(45) Date of Patent: Oct. 4, 2016

(54) TILE-BASED COMPRESSION AND DECOMPRESSION FOR GRAPHIC APPLICATIONS

(71) Applicant: Vivante Corporation, Sunnyvale, CA (US)

(72) Inventors: Lefan Zhong, San Jose, CA (US); Halim Theny, San Ramon, CA (US); Huiming Zhang, Shanghai (CN)

(73) Assignee: Vivante Corporation, San Jose, CA (US)

( * ) Notice: Subject to any disclaimer, the term of this patent is extended or adjusted under 35 U.S.C. 154(b) by 291 days.

(21) Appl. No.: 13/919,691

(22) Filed: Jun. 17, 2013

(65) Prior Publication Data

US 2014/0301641 A1    Oct. 9, 2014

Related U.S. Application Data

(63) Continuation of application No. 13/856,389, filed on Apr. 3, 2013, now abandoned.

(51) Int. Cl.
*G06T 9/00* (2006.01)
*G06K 9/36* (2006.01)
(Continued)

(52) U.S. Cl.
CPC . *G06T 9/00* (2013.01); *G06F 3/14* (2013.01); *G09G 5/393* (2013.01); *H03M 7/3086* (2013.01); *H03M 7/40* (2013.01); *H04N 19/88* (2014.11); *H04N 19/91* (2014.11); *G09G 5/14* (2013.01); *G09G 2340/02* (2013.01); *H04N 19/593* (2014.11)

(58) Field of Classification Search
CPC ............. G06F 3/14; G06T 1/00; G06T 9/00; G09G 5/39; G09G 5/393; H03M 7/3086; H03M 7/40; H03M 7/4043; H04N 19/593; H04N 19/88; H04N 19/91
See application file for complete search history.

(56) References Cited

U.S. PATENT DOCUMENTS 7,039,241 B1    5/2006    Van Hook
7,342,590 B1    3/2008    Danskin
(Continued)

FOREIGN PATENT DOCUMENTS

WO    WO 02071622 A2    9/2002

OTHER PUBLICATIONS

Translated abstract of JP60-142637.*

*Primary Examiner* — Sing-Wai Wu
(74) *Attorney, Agent, or Firm* — David R. Stevens; Stevens Law Group (57) ABSTRACT

Systems and method for tile-based compression are disclosed. Image data, such as a frame, may be divided into tiles. The tiles may be sized based on a size of a line buffer. Tiles are compressed and decompressed individually. As portions of the image frame are updated, corresponding updated tiles may be compressed and stored. Likewise, as tiles are accessed they may be de-compressed and streamed to a requesting device. In some embodiments, a decoder operable to decompress tiles may be interposed between a memory device and a requesting device. Data encoding one or more compressed tiles may be grouped to enable decompression at a rate of four pixels per clock cycle. Methods for compressing image data including both RGB and RGBα components are disclosed.

20 Claims, 8 Drawing Sheets

(51) Int. Cl.
  *G06F 3/14*    (2006.01)
  *G09G 5/393*   (2006.01)
  *H03M 7/30*    (2006.01)
  *H03M 7/40*    (2006.01)
  *H04N 19/91*   (2014.01)
  *H04N 19/88*   (2014.01)
  *H04N 19/593*  (2014.01)
  *G09G 5/14*    (2006.01)

(56) References Cited

U.S. PATENT DOCUMENTS

| | | |
|---|---|---|
| 2003/0179938 A1* | 9/2003 | Van der Vleuten .......... 382/232 |
| 2006/0171596 A1* | 8/2006 | Sung .................... H04N 19/105 |
| | | 382/232 |
| 2009/0080788 A1 | 3/2009 | Lynch |
| 2012/0200575 A1 | 8/2012 | Stroem |

* cited by examiner

TILE-BASED COMPRESSION AND DECOMPRESSION FOR GRAPHIC APPLICATIONS

RELATED APPLICATIONS

This application is a continuation of U.S. application Ser. No. 13/856,389, filed Apr. 3, 2013, and entitled Tile-Based Compression and Decompression for Graphic Applications, which is hereby incorporated herein by reference in their entirety.

BACKGROUND

1. Field of the Invention

This invention relates to systems and methods for compressing and decompressing image data

2. Background of the Invention

Modern graphics engines typically render or compose images into a frame buffer, which is usually the system memory or DDR. In many such systems, the graphic hardware and system memory are not on the same die. Graphic hardware is also often pushed to its limit to process higher resolution, complex graphics, as well as dealing with multiple sources and targets for graphics data.

As a result, increasing amounts of data need to be moved around the graphics and other sub-systems very quickly. Moving large amounts of data at very high speed presents challenges with respect to power, thermal, and performance requirements. It is therefore crucial to reduce bandwidth required for data moving in and out of the system memory. Many systems are operable to compress data, store it, and then un-compress the data when it is needed.

The systems and methods described herein provide an improved approach for incorporating compression and decompression of image data into a graphics processing system.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods for compressing an image frame in a plurality of tiles. The tiles may have a size equal to a buffer size of a device in a graphics system, such as a line buffer. Tiles may further be formatted such that the tile may be decompressed as the data of the tile is streamed between devices, such as by an in-line decoder.

In most use cases of graphics rendering or composition, only small portion of an entire image or frame needs to be changed or updated. Many traditional image or video compression work on a line-by-line or frame-by-frame basis. Those compression techniques are well suited for images, which are already available in full-frame or full-line for compression to be performed, such as a video frame or a still picture frame, which can be stored and played back repeatedly. However, in many instances a graphical two-dimensional or three-dimensional frame is generated live as each frame is rendered and sent for display only once. For example, a graphical user interface may need to be generated again after screen touch, or other interaction, by a user and then re-displayed on screen.

A graphical image or frame is usually mapped onto specific memory locations with a certain access pattern. In embodiments disclosed herein, a frame may be gridded into tiles such that only certain affected tiles need to be updated and the corresponding memory locations changed. Each tile may then be compressed and decompressed individually to provide both flexibility and a high compression ratio. The size and aspect ratio of each tile may be selected to improve the efficiency of memory access and overall system performance. Experiments conducted by the inventor have found that the methods disclosed herein can achieve a compression efficiency of 10.05 bits per 24 bit pixel for eight test images and a 32 byte burst and 12.19 bits per pixel for eight test images with a 64 byte burst.

Experiments conducted by the inventor have also found certain factors useful in selecting a tile size. For example, experiments conducted by the inventor have shown that a tile that covers a span of 16 to 64 pixels is suited for many applications, especially in graphics composition. In many systems, a display sub-system will need to process pixels line-by-line in real time with a given refresh rate. The pixel data is typically stored in line buffers, which are on-chip memories that reside locally near the display sub-system. The line buffers generally will have limited size such that they can hold very few lines of pixels at a time, e.g. 1 or 2 lines. Accordingly, a height of a tile may advantageously be limited to 1 or 2 pixels tall per tile, e.g. the number of lines in the line buffer. Therefore, a tile size of 8-64 pixels horizontally (e.g. a width of the line buffer) by 1-2 pixels vertically may advantageously make effective use of a line buffer of limited capacity dimension.

Given that many DDR (double data rate) memory accesses are constrained to be 256 bytes aligned, the boundaries of tiles may advantageously be constrained to lie on 256 byte boundaries. Inasmuch as pixels typically include 32 bits (4 bytes) of data per pixel, there will be 64 pixels per 256 bytes memory data. Accordingly, matching this 64-pixel constraint may advantageously include using tile dimensions of 64×1 or 32×2. Where an image has dimensions that are not a multiple of a tile size, a last pixel in a row may be repeated to populate a tile.

Each tile of an image or a frame may be compressed and decompressed individually. Each compressed tile data may be transferred and written into memory locations that are aligned with subsequence tiles. For prior compression algorithms, it is difficult to obtain a significant compression ratio for small data blocks, such as on the order of tiles described herein. The systems and methods described herein provide large compression ratios for tiles on the order of, for example 64×1, 32×2, 16×4, and 8×8 pixels, as well as for other tile sizes.

In some embodiments, in addition to tile data for tiles constituting a frame, a header, or tile status data, may also be associated with a frame and contain compression information. The header may contain a small amount of data and be stored in memory with the tiles of a frame. The display controller may be operable to fetch this tile status data from memory and request compressed tiles for the frame. The tiles may then be decompressed and returned to the display controller line-by-line.

Systems and methods for decompressing tiles in a graphics system are described in greater detail below.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
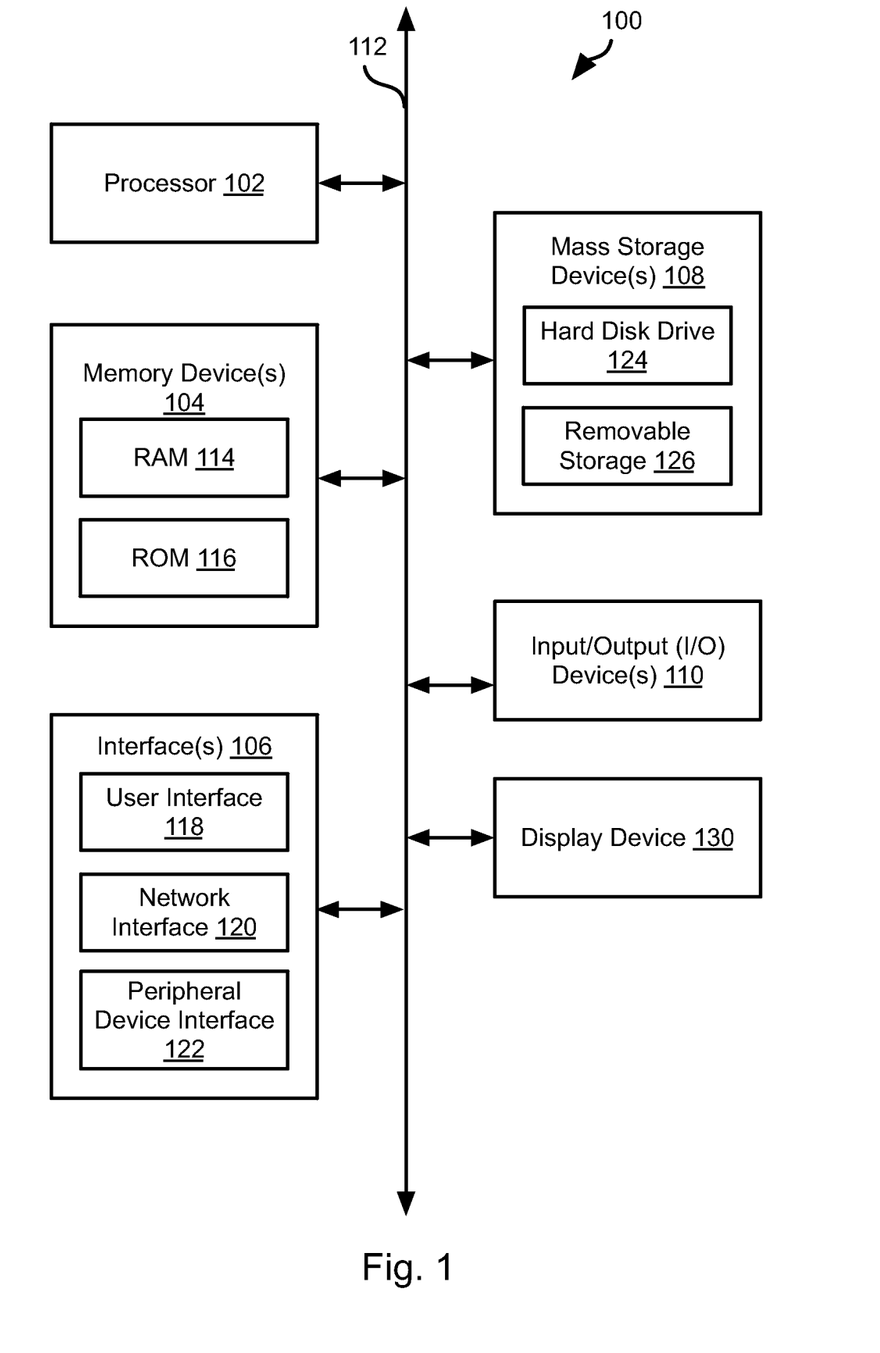
FIG. 1 is a schematic block diagram of a computing system suitable for implementing methods in accordance with embodiments of the invention.

FIG. 1 is a block diagram illustrating an example computing device 100. Computing device 100 may be used to perform various procedures, such as those discussed herein. Computing device 100 can function as a server, a client, or any other computing entity. Computing device can perform various monitoring functions as discussed herein, and can execute one or more application programs, such as the application programs described herein. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer readable media, such as magnetic tapes, magnetic disks, optical disks, solid-state memory (e.g., Flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
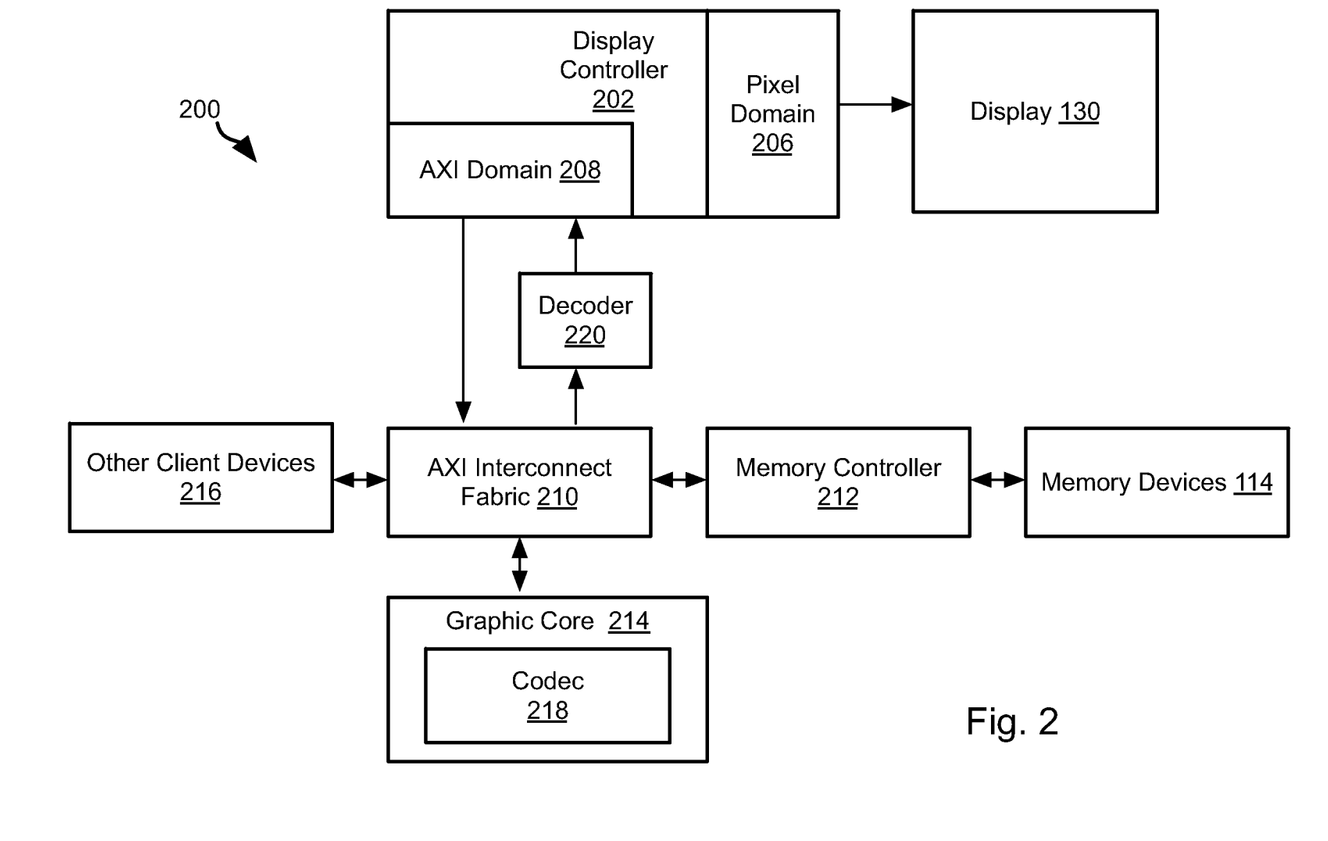
FIG. 2 is a schematic block diagram of a components of graphics and display processing system in accordance with an embodiment of the invention.

Referring to FIG. 2, a computing device, such as the computing device 100 may incorporate a graphics system 200 including some or all of the illustrated components along with any other components used for graphics processing known in the art.

The graphics system 200 may include a display controller 202 coupled to a display 130. As known in the art, a display controller 202 may be operable to convert a frame of pixels into digital or analog video signals for invoking display of a representation of the frame on the display 130. The display controller 202 may include a pixel domain 206 to facilitate synchronous transmission of pixel data to the display 130 according to the digital visual interface (DVI) protocol, or some other protocol.

The display controller 202 may communicate with one or more devices by means of a bus, such as cache coherent bus architecture like the advanced extensible interface (AXI) specification. The display controller 202 may include an AXI domain 208 to facilitate synchronous communication over the AXI bus. The AXI specification permits burst based transactions based only on a start address. As will be described in greater detail below streaming of data in burst mode may advantageously be performed using compressed tile data.

The display controller 202 may be operably coupled to an AXI interconnect fabric 210 that may connect other devices to the display controller 202 and to one another. For example, the AXI interconnect fabric 210 may connect to a memory controller 212, graphic core 214, and any other client devices 216.

In many applications, a graphic core 214 may include a codec 218 that is used for compression and decompression of image and video data. In many instances, the codec 218 may be from a different vendor than the display controller 202 and accordingly is not readily used by the display controller 202 for performing compression and decompression of video data.

As will be described in greater detail below, tile-based compression and decompression methods described herein may advantageously use a decoder 220 interposed between the AXI interconnect fabric 210, or some other interface to a memory device, and the display controller 202. The decoder 220 may communicate with the AXI domain 206 of the domain controller. That is to say that the data from the decoder 220 may transparently transmit decompressed pixels to the display controller 202 in the context of communication according to the AXI protocol. As is also described herein, the decoder 220 may advantageously perform streaming decompression of pixel data transmitted to the display controller that is transparent to the display controller 202 thereby facilitating rapid rendering of pixel data while reducing the amount of memory required to store the pixel data.

Figure 3:
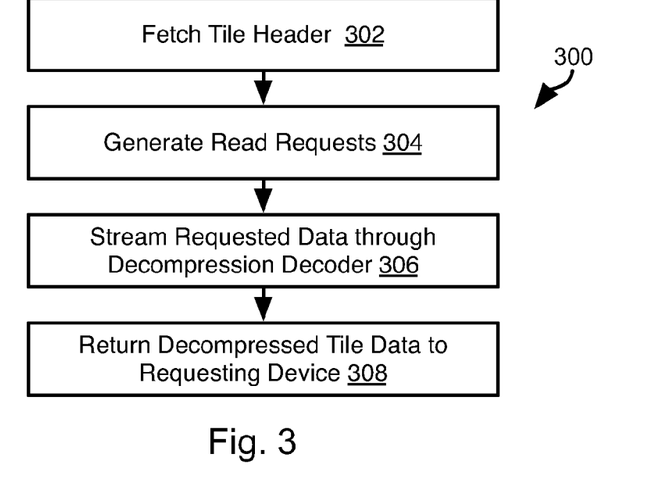
FIG. 3 is a process flow diagram of a method for in-line decompression of graphics data in accordance with an embodiment of the invention.

For example, FIG. 3 illustrates a high-level method 300 by which compressed pixel data stored in a memory device 114 may be streamed to a display controller 202, or other device such as a graphic core 212. A more detailed description of the steps of the method 300 is included below.

When a device accesses a particular pixel location, the corresponding tile may then be decompressed. For example, in the context of the system 200 of FIG. 2, the method 300 may include fetching 302 a tile header. The tile header may include information describing tiles of a frame such as the size of each compressed tiled, a starting address for each tile, a range of memory locations in which the tiles of a frame are stored, or other data. In some embodiment, each tile has a tile status value, e.g. 4 bits. Values of 1 to 8 for the tile status value indicate how many 32-bytes are required to decode the tile, e.g. a compressed tile size. For color format RGB888, a tile status value of 6 may indicate that a tile includes raw RGB888 data. RGBα8888 data, the value of 6 may indicate compressed data and a tile status value of 8 may indicate that a tile includes raw RGBα8888 data. The step of fetching 302 the tile header may be performed by a requesting device, such as the display controller 202, in the process of retrieving pixel data for rendering a frame on a display 130. The request for the tile header may be directed to the memory controller 212 by way of the AXI interconnect fabric 210.

Using the tile header, the requesting device may then generate 304 read requests for pixels within the tile, or request entire tiles, of a frame. For example, the requesting device may request a number of bytes corresponding to a next tile in the frame, where the number of bytes in the tile is indicate by tile status data for the tile. The read requests may be transmitted to the memory controller 212. As the memory controller 212 responds to the read requests, a compressed data stream corresponding to the read requests may be streamed 306 to the requesting device through the decoder 220 that is operable to decode the data stream in real time. A method for decoding the compressed data stream is described in greater detail below. The decoder then returns 308 the decompressed data to the requesting device. As noted above, the AXI interface provides for burst data transfer whereby a data request need only specify a starting address. In some embodiments, a burst transfer of a compressed tile may be transmitted through the decoder, decompressed by the decoder, and the decompressed data transmitted to the requesting device in a transparent manner. As will be described in greater detail below, compressed tiles may be one or both of stored and transmitted in a manner that allows for streaming decompression of individual pixels within the tile.

Figure 4:
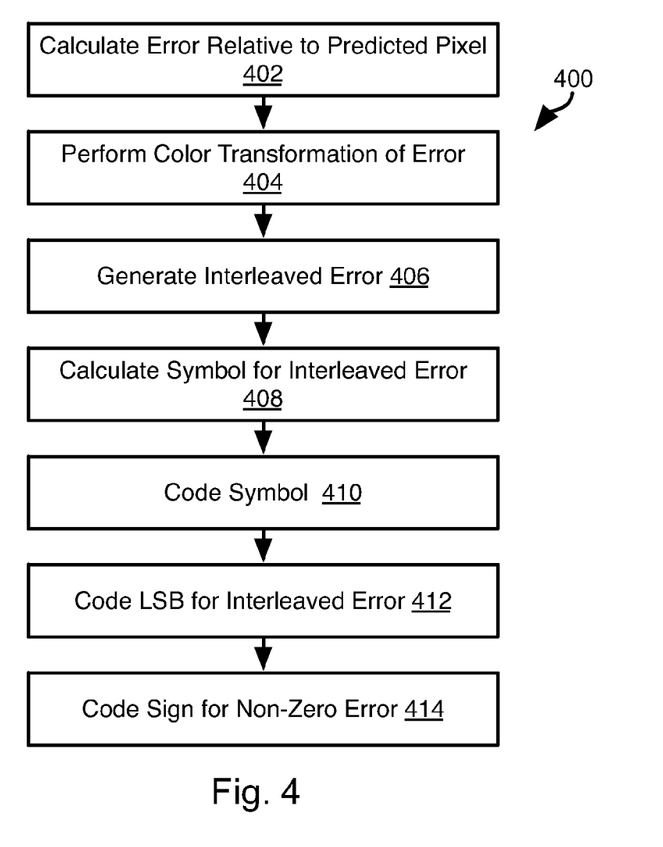
FIG. 4 is a process flow diagram of a method for compressing graphics data in accordance with an embodiment of the invention.

FIG. 4 illustrates a method 400 for compressing a tile of pixels. In particular, the method 400 illustrates a method for compressing an individual pixel (a "current pixel") of a tile, which may be repeated for all pixels of a tile exclusive of an initial pixel. The method 400 may be executed by an electronic device within a graphics system or such as within a graphics core 212 or some other processor.

The method 400 may include calculating 402 an error of the current pixel relative to a predicted pixel. The predicted pixel may include a preceding pixel in a tile. The initial pixel of a tile may be included in a compressed tile without compression. Calculating the error may include calculating errors for each component (RGB or RGBα) relative to the corresponding component of the predicted pixel. Accordingly, the error may be an array of errors OrgError[i]= Current[i]−Predicted[i], where i is a value from 0 to 2, corresponding to red, green, and blue components for RGB and from 0 to 3 for RGBα, where the fourth value represents the alpha error.

The method 400 may include performing 404 a color transformation of the errors (OrgError[i]). For example, a reversible color transformation (RCT) Error[i] may be performed as follows: Error[2]=OrgError[2]−OrgError[1]; Error[1]=OrgError[1]−OrgError[0]; Error[0]=OrgError[0]. The RCT transformation results in a savings of almost one bit per pixel or about 8% of the bandwidth for natural images.

The method 400 may include generating 406 an interleaved error for the color-transformed error. In particular, generating 406 the interleaved error may include interleaving the absolute values of the color-transformed errors. For example where AbsError[i]=Abs(Error[i]), and $R_n \ldots R_0$ are the bits of AbsError[0], $G_n \ldots G_0$ are the bits of AbsError[1], and $B_n \ldots B_0$ are the bits of AbsError[2], the interleaved error may be expressed as PackAbsError=$R_n G_n B_n R_{n-1} G_{n-1} B_{n-1} \ldots R_0 G_0 B_0$. Stated differently, the i-th bit of PackAbsError is the (i/3)-th bit of AbsError[i %3]. A size may also be determined for the interleaved error. The size may be expressed as PackAbsErrorSize=LeadingOnePosition(PackAbsError)+1. For example, if the interleaved error is 10010, PackAbsErrorSize is 5. If PackAbsErrror is equal to zero its size is also zero.

The method 400 may include calculating 408 a symbol for the interleaved error and coding 410 the symbol. A method for calculating 408 the symbol is described below with respect to FIG. 5. Coding 410 the symbol may include using a variable length coding (VLC) method that can take advantage of the fact that the interleaved error is variable in size. In the illustrated example, Huffman coding is used. A method for coding 410 the symbol is described below with respect to FIG. 6.

As will be described in greater detail below, the symbol and coding of the symbol may not encode all of the bits of the interleaved error. Accordingly, the method 400 may include coding 412 the un-encoded least significant bits (LSB) of the interleaved error (e.g. PackAbsError). A method for coding 412 the LSB of the interleaved error is described in greater detail below with respect to FIG. 7.

As noted above, the interleaved error may include interleaved absolute values of errors, or color-transformed errors, as described above. Accordingly, the method 400 may include coding 414 signs of the errors. Inasmuch as whether a particular error (e.g. color-transformed error) is zero or non-zero can be readily determined by de-interleaving the interleaved error, coding 414 the signs for the errors may include only including sign bits for non-zero errors. For example a bit for each non-zero error may be included in a sign string, with 0 representing a positive sign and 1 representing a negative sign. In some embodiments no sign bit is included in the sign string for errors that are included in their raw form. As described in greater detail below, where the interleaved error is above a certain value, the raw pixel data is used to represent the pixel in a compressed tile.

The coded symbol, coded LSB, and coded signs may then be stored in a compressed tile as a representation of the pixel that is the subject of the method 400. An initial pixel for a tile and remaining pixels compressed according to the method 400 may comprise the compressed representation of a tile, such as a tile of a frame composed of a plurality of tiles.

Figure 5:
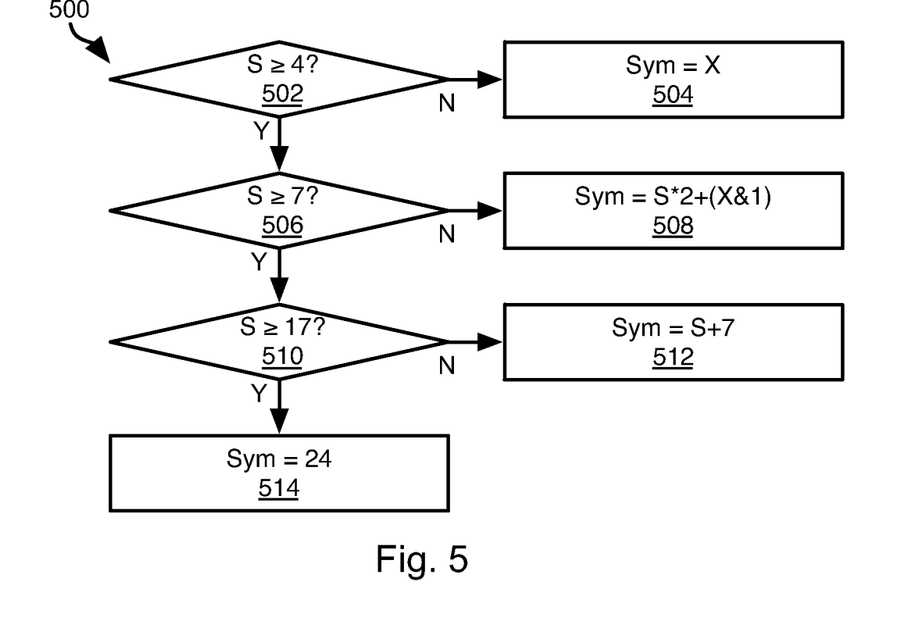
FIG. 5 is a process flow diagram of a method for calculating a symbol for a pixel error in accordance with an embodiment of the invention.

FIG. 5 illustrates a method 500 for coding a symbol for some or all of the bits of an interleaved error, e.g. PackAbsError equal to X and having a size S. The illustrated method 500 is for pixels including 24 bits of color, i.e. 8 bits each for red, green, and blue. Once skilled in the art will recognize that the illustrated values can be readily modified for larger or smaller pixels.

For example, if S is found 502 to be not greater than or equal to 4, the symbol (Sym) may be calculated 504 as equal to X. Otherwise, if S is found 506 to be not greater than or equal to 7, then Sym may be calculated 508 as S*2+(X&1). Otherwise, if S is not found 510 to be greater than 17, the Sym may be calculated 512 as S+7. Otherwise, if S is greater than or equal to 17, then Sym may be calculated as being equal to 24.

Figure 6:
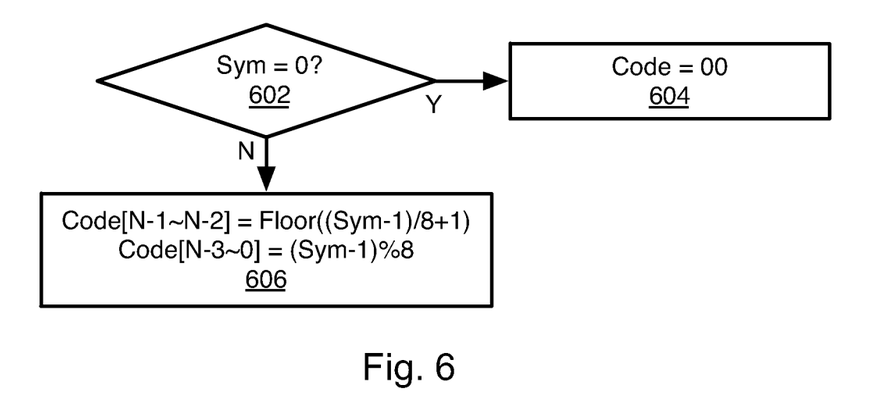
FIG. 6 is a process flow diagram of a method for coding a symbol for a pixel error in accordance with an embodiment of the invention.

Referring to FIG. 6, the symbol, such as a symbol determined according to FIG. 5, may be coded using a variable length coding (VLC) method, such as Huffman coding. For example, the method 600 may include evaluating 602 whether Sym is equal to zero. If so, then the symbol may be coded as being equal to zero, or two zero bits 00.

Otherwise, the method 600 may include VLC coding the symbol. For example, the symbol may be encoded with a first portion equal to HuffmanTable[0][Sym] and a second portion equal to HuffmanTable[1][Sym]. For example, a value Code of length N may be calculated 606 as Code[N-1~N-2]=Floor((Sym-1)/8+1) and Code[N-3~0]=(Sym-1)%8. In the illustrated method N is equal to 5. However other lengths may also be used, depending on the size of the pixels being compressed.

Figure 7:
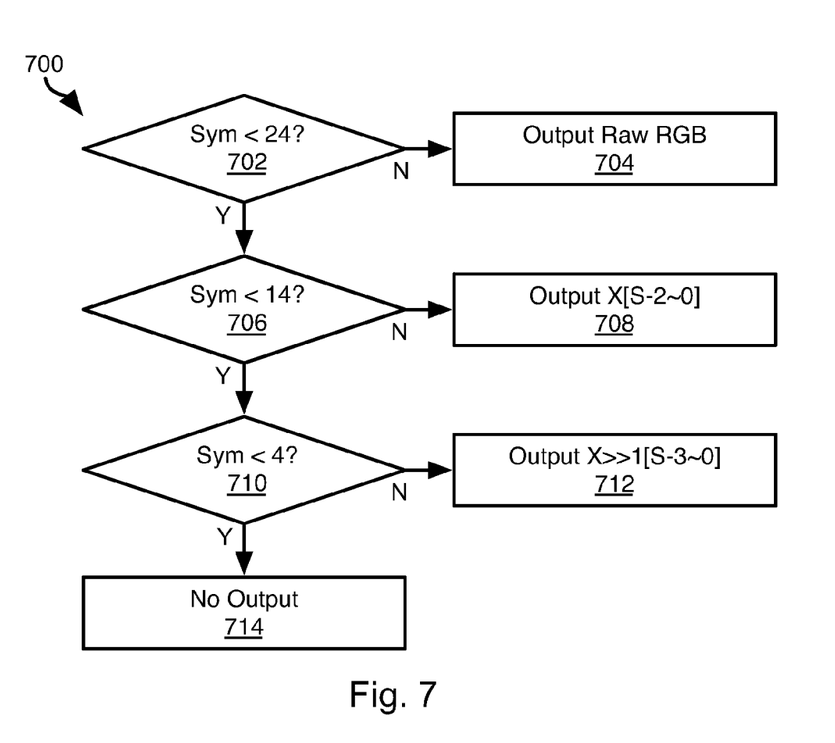
FIG. 7 is a process flow diagram of a method for coding least significant bits of a pixel error in accordance with an embodiment of the invention.

Referring to FIG. 7, as noted above, the symbol and the coded representation thereof may not encoded the entirety of the interleaved error. Accordingly, the method 700 of FIG. 7 may be used to encode the least significant bits, if any not encoded by the coded symbol. For example, if the symbol (e.g. Sym from FIG. 5) is found 702 not to be less than 24, the raw RGB values may be output 704, e.g. the compressed version of the pixel will simply be the RGB values for the pixel.

Otherwise, if Sym is found 706 not to be less than 14, then the value X[S-2~0] may be output 710 (e.g. all but the leading bit of the interleaved error, PackAbsError=X). Otherwise, if Sym is not found 710 to be less than 4, then the value X>>1 [S-3~0] may be output 712, e.g. all but the leading bit of X right shifted by one bit. Otherwise, if Sym is found to be less than 4, no bits are output 714 to encoded the LSB of the interleaved error. As noted above, the recited values are exemplary only and will be different for pixels of different sizes.

Figure 8:
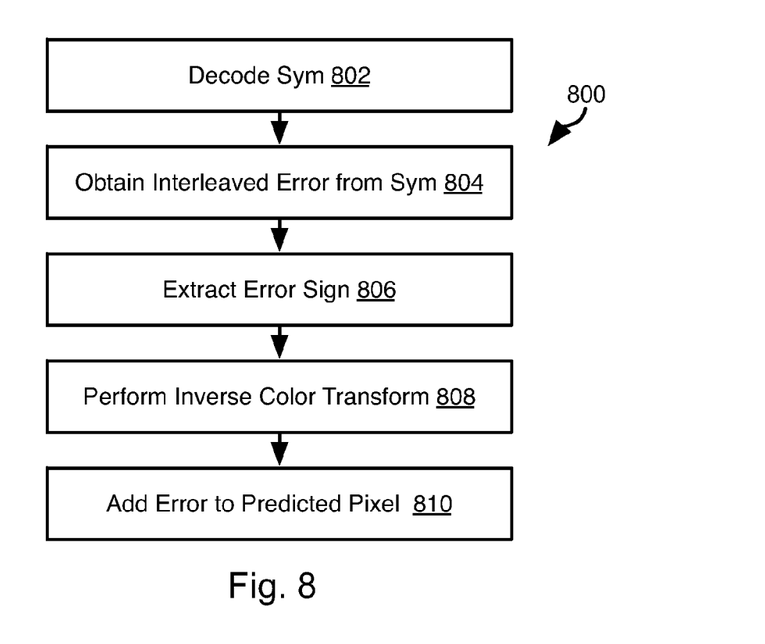
FIG. 8 is a process flow diagram of a method for decoding compressed graphics data in accordance with an embodiment of the invention.

FIG. 8 illustrates a process 800 of decompressing a pixel compressed according to the foregoing methods. In general, decompressing a pixel is the reverse of the process of compression. In particular, the encoded symbol is decoded 802 and the interleaved error is obtained 804 from the symbol. Sign bits for any non-zero errors are extracted 806. Where the interleaved error is the result of a color transform, such as RCT, an inverse color transform is performed 808 on the interleaved error to obtain absolute values of the individual error components (e.g. OrgError[i], above). The individual error components are then signed according to the extracted sign bits and are then combined 810 with, e.g. added to, the predicted pixel to obtain the original pixel. As noted above, where the symbol (Sym) indicates a pixel in its raw form is to be used, no sign bits will be included for that pixel.

Figure 9:
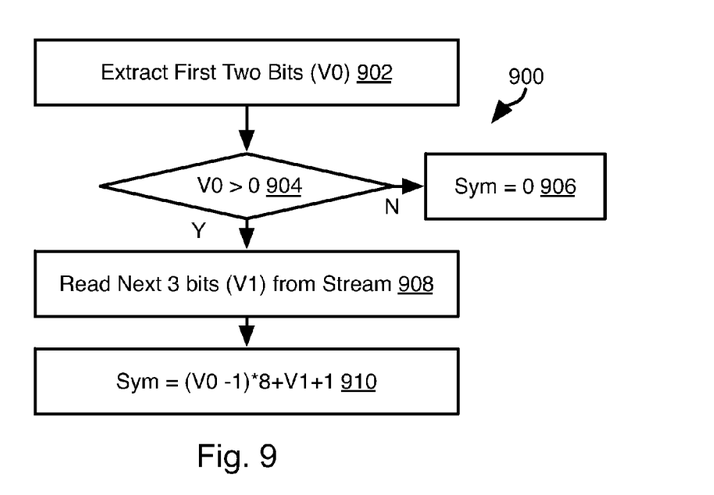
FIG. 9 is a process flow diagram of a method for extracting a symbol from compressed graphics data in accordance with an embodiment of the invention.

FIG. 9 illustrates a method 900 for extracting a symbol from a bitstream, such a stream of bits from a tile. Execution of the method 900 may be preceded by extracting an initial pixel from the bitstream. Subsequent bits may then be processed according to the method 900.

The method 900 may include extracting 902 the next two bits (V0) of the bitstream. If V0 is found 904 to not be greater than zero, then the value of Sym is set to zero. The value Sym=0 corresponds to an interleaved error of zero. Accordingly, the uncompressed value for the pixel being decompressed will be the value of the preceding pixel in the tile. If the first two bits are not found 904 to be zero, then the method 900 may include reading 908 the next three bits (V1) from the bitstream and computing 910 the symbol Sym according to Sym=(V0−1)*8+V1+1.

Figure 10:
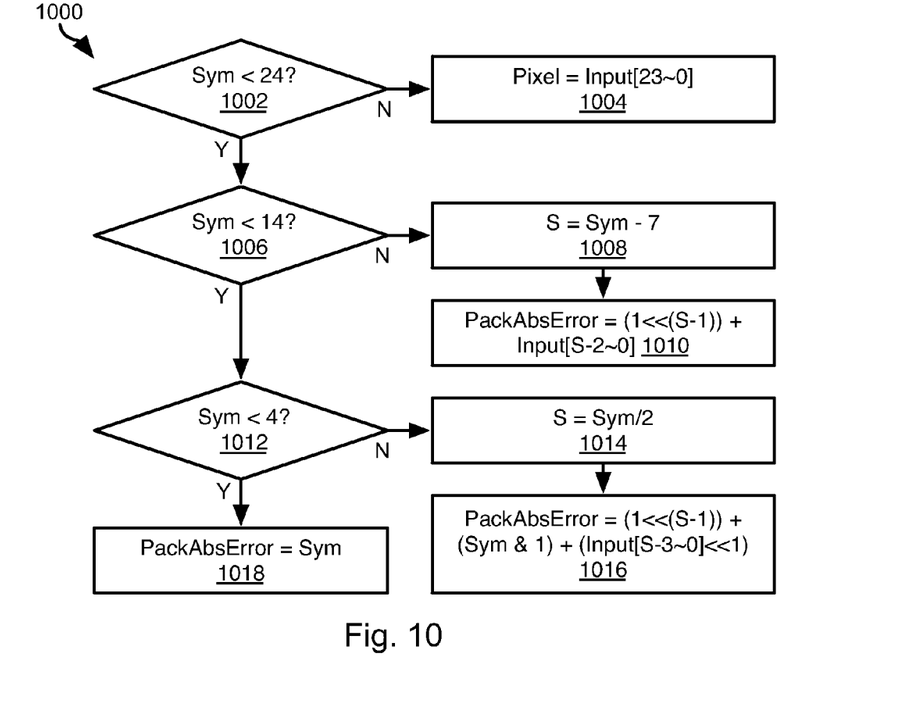
FIG. 10 is a process flow diagram of a method for decoding an interleaved error extracted from compressed graphics data in accordance with an embodiment of the invention.

FIG. 10 illustrates a method 1000 for obtaining the interleaved error (e.g. PackAbsError) from the extracted symbol Sym. If Sym is not found 1002 to be less than 24, then Pixel (e.g. the decompressed pixel) may simply be set equal to 24 bits of the bitstream Input[23~0], the following 24 bits of the bitstream either inclusive or exclusive of V0 and V1, depending on the embodiment.

If Sym is found 1002 to be less than 24, then, if sym is not found 1006 to be less than 14, a size S of the interleaved error is set 1008 equal to Sym −7 and the interleaved error (e.g. PackAbsError) is set equal to (1<<(S-1))+Input[S-2~0], where Input[S-2~0] are S-1 bits in the bitstream following V0 and V1.

If Sym is found 1006 to be less than 14 and is not found 1012 to be less than 4, then the size S is set equal to Sym/2 and PackAbsError is set 1016 equal to (1<<(S-1))+(Sym&1)+(Input[S-3~0]<<1), where Input[S-3~0] is the S-2 bits in the bitstream following V0 and V1. In steps 1010 and 1016 the bits of Input[ ] added to the interleaved error include any least significant bits associated with the interleaved error. If Sym is found 1012 to be less than 4, then PackAbsError is set equal to Sym.

Figure 11:
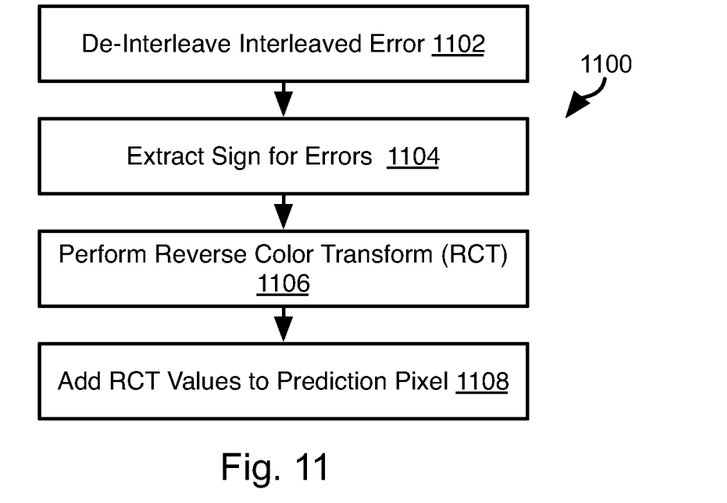
FIG. 11 is a process flow diagram of a method for extracting a final pixel value from decompressed error data.

FIG. 11 illustrates a method 1100 for extracting pixel components from the interleaved error, such as PackAbsError as recovered according to methods 900 and 1000. The method 1100 may include de-interleaving the interleaved error to obtain individual error values, e.g. the AbsErrors[i] calculated during compression. For example the j-th bit position of AbsError[i] may be set equal to the value at bit position 3*j+i of PackAbsError. For example, where PackAbsError includes bits b15, b14, b13, b12, b11, b10, b9, b8, b7, b6, b5, b4, b3, b2, b1, and b0, then AbsError[0]=b15, b12, b9, b6, b3, b0; AbsError[1]=b13, b10, b7, b4, b1; and AbsError[2]=b14, b11, b8, b5b2.

The signs for the AbsError[i] values may follow the bits in the bitstream encoding the interleaved error. Accordingly, for each non-zero AbsError[i] a sign bit may be extracted 1104 from the bitstream, e.g. in order AbsError[0] to AbsError[2], and values of Error[i] obtained by changing the sign as indicated by the sign bit, e.g. negating AbsError[i] if the corresponding sign bit is 1. As noted above, some pixels may be encoded in their raw form. Accordingly, no sign bit may be encoded or applied to such pixels.

Using the values obtained for Error[i], a reverse color transform (RCT) may be performed 1106 to obtain original error values for the pixel being decompressed relative to a prediction pixel. For example, OrgError[0]=Error[0]; OrgError[1]=Error[1]+OrgError[0]; and OrgError[2]=Error[2]+OrgError[1]. The color values for the pixel (Current[i]) may then be obtained by adding 1108 the error values to the prediction pixel. For example, by calculating Current[i]=OrgError[i]+Predicted[i], for i=1-3 for R, G, and B values, respectively.

Figure 12:
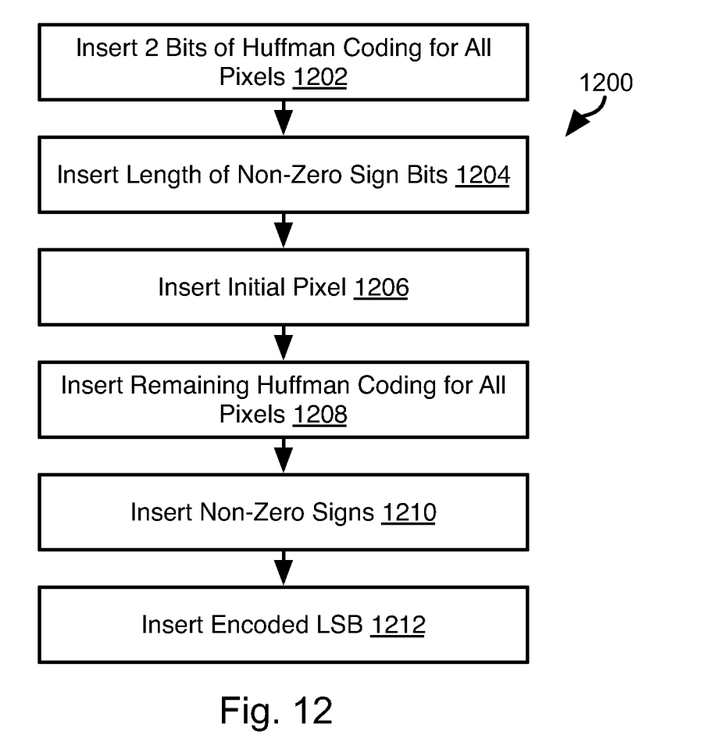
FIG. 12 is a process flow diagram of a method for formatting compressed tile data for streaming in accordance with an embodiment of the invention.

Referring to FIG. 12, as noted throughout tiles may be decoded "on the fly" as tile data is retrieved by a requesting device such as a display controller 202. In some embodiments, data encoding tiles may be ordered in such a way as to enable a bitstream of compressed tile data to be decoded at a rate of four pixels per clock cycle.

The process of decoding described above with respect to FIG. 11 may be characterized as including 5 stages:

Stage 1: Get first 2 bits. If the 2 bits are zeros, repeat previous pixel color channels;

Stage 2: Get 3 bits if necessary, pack with 2 bits of step 1 to get Sym (put stage 1 result as MSB of Sym)

Stage 3: From Sym obtain number of LSB needs to decode PackAbsError

Stage 4: De-Interleave the PackAbsError, identify non zero errors, get sign bits for the nonzero errors.

Stage 5: Perform Inverse Color transform and add original errors (OrgError[i]) to the prediction pixel (Prediction[i]) to obtain RGB component values for the current pixel.

After each of the stages 1-5, it is apparent whether the subsequent stages need to be processed and the number of bits from the bitstream to be processed in the subsequent stages. Stage 5 does not require additional bits from the bitstream.

By grouping 4 pixels together, there will be 16 groups for a 64 pixel tile (groups 1 to 16). For each group of pixels, the bits corresponding to each of the stages 1-5 may be grouped together. Accordingly, a bit stream may include bit strings Code 0-0, Code 0-1 . . . Code i-0 . . . Code i-j . . . Code 16-5, where Code i-j includes the i-th group's j-th stage bits. As noted above, the bits representing some pixels may not include code for all of the stages 1-5.

In some embodiments, the bits corresponding to any of the stages 1-5 for each pixel may be grouped together for all pixels of a tile. Accordingly, the method 1200 may include inserting 1202 two bits of Huffman coding, e.g. the first two bits of coded Sym, for all pixels in a first contiguous segment. For a 64 pixel tile there will therefore be 2×63 bits in the first contiguous segment since an initial pixel is not compressed.

The method 1200 may further include inserting 1204 a length of the bit string representing the signs of any non-zero errors, exclusive pixels included in their raw form. In the illustrated embodiment, these bits are inserted after the first contiguous segment. The sign bits may advantageously be inserted after the first contiguous segment inasmuch as it is typically smaller (up to nine bits) than the bits corresponding to stage three, which is used prior to the sign bits, which are used in stage 4.

The method 1200 may include inserting 1206 an initial pixel, e.g. a first pixel in a tile, in its raw, uncompressed form after one or both the first contiguous segment and the length of the sign bit string. The remaining Huffman coding for the pixels of the tile, other than the initial pixel, may be grouped into a second contiguous segment. The remaining Huffman coding may include any bits of coded Sym other than the first two bits included in the first contiguous segment. The second contiguous segment has variable length. However, inasmuch as the length of the second contiguous segment can be determined using the first segment, a length of the second contiguous segment need not be included.

The method 1200 may include inserting 1210 a bit string including sign bits for any non-zero errors. A third contiguous segment including encodings of any LSB for the pixels of the tile may be inserted 1212 as well. Inasmuch as the number of LSB for the pixels may be zero or a variable number of non-zero values, the length of the third contiguous segment is variable. The length of the third contiguous segment can be determined using the first and second contiguous segments, accordingly, a length of the third contiguous segment need not be included. The start point of the third contiguous segment may be determined using the length inserted at step 1204.

The various segments may have various orderings in a bitstream or in a stored representation of a compressed tile.

In one embodiment the compressed tile may be arranged in the following order: the first contiguous segment, the length of the sign bit string, the initial pixel, the second contiguous segment, the sign bit string, and the third contiguous segment.

With the bit strings representing the compressed pixels arranged in this fashion, a throughput of four pixels per clock cycle may be readily achieved. In particular, once the k-th stage of the j-th group is decoded, starting points in the bitstream for the bits corresponding to each stage of the (k+1)-th stage of the j-th group are known. Likewise, a start point in each segment is known for the k-th stage of the (j+1)-th group. In this manner, parallelization of the decoding of the pixels of a tile is possible and a throughput of four pixels per clock cycle can be readily achieved.

As is apparent in the detailed description of the compression algorithm in FIGS. 4-7, each pixel will not necessarily include data corresponding each of the decompression stages 1-5. For example, where the first two bits of coded Sym encode the entire Sym for a pixel, the second contiguous segment may not include bits for that pixel.

As noted above, the third contiguous segment has variable length. In some embodiments, if the third contiguous segment has an odd number of bits, one or more of the sign bits may be added to the third contiguous segment such that it has an even number of bits or ends on a byte boundary, 16 bit boundary, or some other boundary. Accordingly, for example, if PackAbsError size is found to be an even number over 6 or 5 (e.g. 5, 8, 10, 12, 14, or 16), then the stage 3 bits may be understood to include one sign bit and that sign bit should not be repeated in the sign bit string (e.g. stage 4 bits).

As also noted above, where the interleaved error is large, the raw RGB data for a pixel may be included in its raw form. In such instances, 16 most significant bits of the raw pixel data may be included in stage 3 for that pixel (the third contiguous segment) and the remaining 8 LSB may be included in stage 4 (e.g. with the sign bits). The number of bits included in the sign bit string may be extracted by evaluating the value of Sym extracted from the first contiguous segment for the pixel or from both the first and second contiguous segments. For example, where Sym indicates that a pixel has been included in its raw form, the 16 MSB may be retrieved from the third contiguous segment and the remaining 8 LSB can be retrieved from the sign bit string, e.g. the stage 4 bits. Inasmuch as stage 3 has a very variable length (from 0 to 24*4) and the start point of the stage 3 bits is variable, the above-described approach advantageously ensures that the each pixel in the group starts at an even offset point.

As noted above, a size of the third contiguous segment may be determined using data from the first and second contiguous segments. In some embodiments a size of the stage 3 bits (the LSB) may be encoded. For example, for a current pixel, if Error[0] and Error[1] are zero, the size of the stage 3 bits for Error[2] may be packed in place of the sign bits for Error[0] and Error[1]. For example, the sizes of stage 3 for various pixels, i.e. Sym values, are listed below in Table 1.

TABLE 1

Sym Values vs. PackAbsErrorSize and Stage 3 Bit Length

| Sym | PackAbsErrorSize | Stage 3 bit length |
|---|---|---|
| 0~7 | 0~3 | 0 |
| 8, 9 | 4 | 2 |
| 10, 11 | 5 | 4 (one sign bit packed in) |
| 12, 13 | 6 | 4 |

TABLE 1-continued

Sym Values vs. PackAbsErrorSize and Stage 3 Bit Length

| Sym | PackAbsErrorSize | Stage 3 bit length |
|---|---|---|
| 14 | 7 | 6 |
| 15 | 8 | 8 (one sign bit packed in) |
| 16 | 9 | 8 |
| 17 | 10 | 10(one sign bit packed in) |
| 18 | 11 | 10 |
| 19 | 12 | 12(one sign bit packed in) |
| 20 | 13 | 12 |
| 21 | 14 | 14(one sign bit packed in) |
| 22 | 15 | 14 |
| 23 | 16 | 16(one sign bit packed in) |
| 24 | ≥17 | 16 (MSB 16 bits of raw data) |

Figure 13:
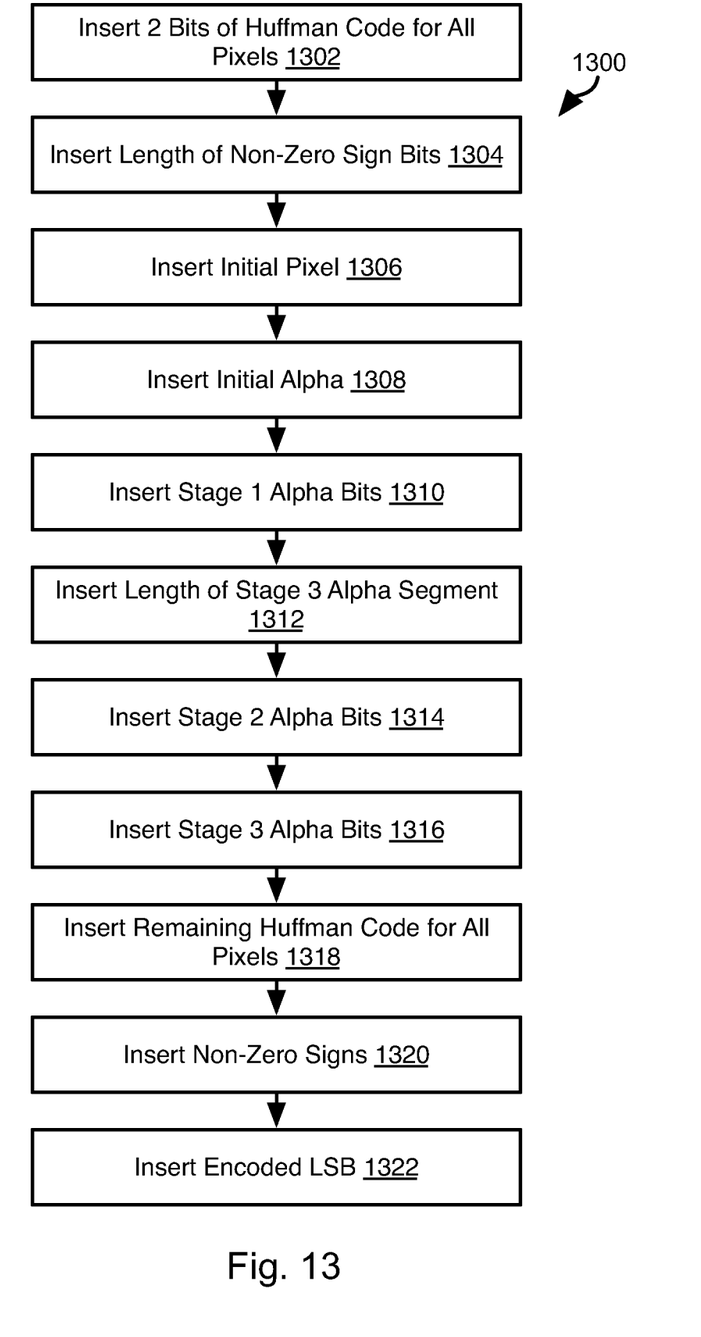
FIG. 13 is a process flow diagram of a method for compressing graphics data including alpha values in accordance with an embodiment of the invention.

Referring to FIG. 13, the methods described hereinabove illustrate compression and decompression techniques for pixels including RGB components. FIG. 13 illustrates a method 1300 for compressing pixels including RGBa components.

The method 1300 may include inserting 1302 two bits of Huffman coded symbols, such as a first contiguous segment of such bits in the same manner as for the method 1200. Likewise a length of non-zero sign bits for the pixels of a tile may be inserted 1304, in the same manner as for the method 1200. An initial pixel (RGB values thereof) may also be inserted 1306. An alpha value for the initial pixel may also be inserted 1306.

Alpha values for remaining pixels may be compressed in groups, such as groups of 4 pixels. The representation for a group of pixels may include three stages. As for the method 1200, the bits for each stage may be grouped together, e.g. all stage 1 bits in a contiguous segment, all stage 2 bits in one contiguous segment, and all stage 3 bits in one contiguous segment.

Stage 1 for a group of pixels may include a bit indicating if an error for any pixel of the group of pixels is not zero, where the error for a pixel is a difference between the alpha value for the pixel and the initial alpha value. For example, a stage 1 bit equal to 0 indicates that all errors for all pixels in the group are equal to zero. A stage 1 bit equal to 1 indicates that at least one of the errors is not equal to zero.

Stage 2 for a group of pixels may include three bits for each pixel indicating a size of the error for each pixel. For example, the error may be a value from 0 to 7 (b111) for each pixel. If the error for a pixel is greater than 7, the stage 2 bits for that pixel may be set equal to 7.

For pixels with errors other than 0 and 7, the stage 3 bits may include a sign bit indicating the sign of the error and the least significant bit (LSB) of the error. For pixels with errors equal to 0, no sign or LSB is included in stage 3. For pixels with errors larger than 7, stage 3 will include the raw alpha value.

Referring again to FIG. 13, the method 1300 may include inserting 1310 the stage 1 bits, inserting 1312 a length of the stage 3 bits, inserting 1314 the stage 2 bits, and inserting 1316 the stage 3 bits. As noted above, inserting the bits for a stage may include inserting all bits for that stage for all pixels in the tile. Inasmuch as the length of stage 2 can be readily determined from the stage 1 bits (e.g. 9 bits for a stage 2 bit of 1), a length of stage 2 may be omitted in some embodiments.

The method 1300 may further include inserting 1318 remaining Huffman code (e.g. remaining bits of Sym), e.g. a second contiguous segment as for the method 1200. The method 1300 may also include inserting 1320 signs for non zero interleaved errors such as a string of sign bits, and inserting 1322 encoded least significant bits (LSB), such as a third contiguous segment in the same manner as for the method 1200.

As an example, a bit stream or stored representation of a compressed tile according to the method 1300 may be arranged in the following order: the first contiguous segment, the length of the sign bit string, the initial pixel, the initial alpha value, stage 1 alpha bits, a length of stage 3 alpha bits, the stage 2 alpha bits, and the stage 3 alpha bits, the second contiguous segment, the sign bit string, and the third contiguous segment.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. An apparatus for data compression, the apparatus comprising an electronic device programmed to:
for each pixel of a plurality of pixels:
calculate errors for components of the each pixel relative to components of a prediction pixel;
interleave the errors to generate an interleaved error;
generate a first symbol by Huffman encoding at least a most significant portion of the interleaved error, the most significant portion of the interleaved error having a fixed length;
if the first symbol does not encode the entire interleaved error, generate a second symbol by Huffman encoding a least significant portion of the interleaved error separately from the most significant portion of the interleaved error, the least significant portion of the interleaved error including least significant bits in excess of the fixed length of the most significant portion; and
store the first symbol and any second symbol as a representation of the each pixel in a memory device in association with the prediction pixel;
wherein the electronic device is programmed to store the first symbol and any second symbol as a representation of the each pixel in the memory device in association with the prediction pixel by;
storing the first symbol in a first segment including first symbols for all pixels of the plurality of pixels; and
storing any second symbol in a second segment including any second symbols for all pixels of the plurality of pixels;
wherein all of the first symbols of the plurality of pixels are stored contiguously in the first segment and all of the second symbols of the plurality of pixels are stored contiguously in the second segment, the second segment being different from the first segment.

2. The apparatus of claim 1, wherein the electronic device is programmed to interleave the errors to generate the interleaved error by interleaving absolute values of the errors.

3. The apparatus of claim 2, wherein the electronic device is programmed to store, with the first symbol, sign bits for any of the errors that are not equal to zero.

4. The apparatus of claim 1, wherein the electronic device is programmed to generate the interleaved error by interleaving a color transform of the errors.

5. The apparatus of claim 1, wherein the electronic device is programmed to generate the first symbol encoding at least a most significant portion of the interleaved error by performing Huffman coding using a Huffman table having no more than 25 cases.

6. The apparatus of claim 1, wherein the prediction pixel is a pixel preceding the each pixel in the plurality of pixels.

7. The apparatus of claim 1, wherein the plurality of pixels define a tile of a plurality of tiles, the plurality of tiles defining a frame.

8. The apparatus of claim 1, wherein a number of pixels of the plurality of pixels is equal to a line buffer size of a graphics system component operably coupled to the electronic device.

9. The apparatus of claim 1, wherein the electronic device is programmed to interleave the errors to generate the interleaved error by interleaving absolute values of the errors, the electronic device further programmed to:
store sign bits for any non-zero errors of the errors in a third segment, the third segment including sign bits for any non-zero errors of the errors for all pixels of the plurality of pixels.

10. A method for data compression, the method comprising:
for each pixel of at least a portion of a plurality of pixels, performing, by an electronic device:
calculating errors for components of the each pixel relative to components of a preceding pixel;
interleaving absolute values of the errors to generate an interleaved error;
Huffman coding the interleaved error by encoding a first portion in a first symbol portion and, if the interleaved error has a number of bits in excess of the first portion, encoding a second portion of the interleaved error separately from the encoding of the first portion of the interleaved error, the second portion being separately encoded in a second symbol;
if the first and second symbol portions do not encode the entire interleaved error, generating a third symbol portion by encoding a third portion of the interleaved error separately from the encoding of the first and second portions, the first portion including more significant bits of the interleaved error than the second portion and the second portion including more significant bits of the interleaved error than the third portion; and
streaming the first and second symbol portions, any third symbol portion, and signs of any of the errors that are not equal to zero;
wherein streaming the first and second symbol portions, any third symbol portion, and signs of any of the errors that are not equal to zero further comprises:
streaming the first symbol portions of all of the plurality of pixels as a first contiguous segment;
streaming the second symbol portions of all of the plurality of pixels as a second contiguous segment separate from the first contiguous segment;
obtaining a third contiguous segment including all of any third symbol portions, the third contiguous segment being separate from the first and second contiguous segments;
if a length of the third contiguous segment is odd, moving one bit of the third contiguous segment to the second contiguous segment; and
streaming the signs of the plurality of pixels as a fourth contiguous segment.

11. The method of claim 10, wherein streaming the first and second symbol portions, any third symbol portion, and signs of any of the errors that are not equal to zero further comprises:
streaming the first symbol portions of the plurality of pixels as a first contiguous segment; followed by
streaming the second symbol portions of the plurality of pixels as a second contiguous segment, followed by
streaming any third symbol portions of the plurality of pixels as a third contiguous segment, followed by
streaming the signs of the plurality of pixels as a fourth contiguous segment.

12. The method of claim 11, further comprising inserting a length of the third contiguous segment between the first and second contiguous segments.

13. The method of claim 11, further comprising inserting an initial pixel between the first and second contiguous segments.

14. The method of claim 11, wherein the fourth contiguous segment is inserted between the second and third contiguous segments.

15. The method of claim 10, wherein the plurality of pixels define a tile of a plurality of tiles.

16. The method of claim 15, wherein the plurality of tiles define a frame.

17. The method of claim 15, wherein a size of the tiles of the plurality of tiles is equal to a size of a line buffer of a graphics processing system.

18. The method of claim 14, wherein streaming the first and second symbol portions, any third symbol portion, and signs of any of the errors that are not equal to zero further comprises:
streaming the first and second symbol portions, any third symbol portion, and signs of any of the errors that are not equal to zero to a decoder in response to a request from a second electronic device; and
transmitting a decoded pixel to the second electronic device.

19. The method of claim 18, wherein the second electronic device is a display controller.

20. The method of claim 10, wherein Huffman coding the interleaved error to generate the first symbol portion and the second symbol portion comprises Huffman coding the interleaved error using a Huffman table with no more than 25 cases.

* * * * *